US006577007B1

United States Patent
Mehta

(10) Patent No.: US 6,577,007 B1
(45) Date of Patent: *Jun. 10, 2003

(54) MANUFACTURING PROCESS FOR BORDERLESS VIAS WITH RESPECT TO UNDERLYING METAL

(75) Inventor: Sunil Mehta, San Jose, CA (US)

(73) Assignee: Advanced Micro Devices, Inc., Sunnyvale, CA (US)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/595,150

(22) Filed: Feb. 1, 1996

(51) Int. Cl.[7] .............................................. H01L 23/48
(52) U.S. Cl. ...................................................... 257/750
(58) Field of Search ................................ 257/758, 774, 257/768, 382, 760

(56) References Cited

U.S. PATENT DOCUMENTS

| | | | | |
|---|---|---|---|---|
| 4,057,659 A | * | 11/1977 | Pammer et al. | |
| 4,879,257 A | * | 11/1989 | Patrick | 257/758 |
| 4,966,870 A | * | 10/1990 | Barber et al. | 438/637 |
| 5,005,067 A | * | 4/1991 | Sakata et al. | |
| 5,245,205 A | * | 9/1993 | Higasitani et al. | 257/758 |
| 5,289,037 A | * | 2/1994 | Savignac et al. | 257/758 |
| 5,354,713 A | | 10/1994 | Kim et al. | 437/195 |
| 5,432,128 A | * | 7/1995 | Tsu | 437/194 |
| 5,451,543 A | * | 9/1995 | Woo et al. | 438/637 |
| 5,519,254 A | * | 5/1996 | Tabara | 257/758 |
| 5,592,024 A | * | 1/1997 | Aoyama et al. | 257/751 |

FOREIGN PATENT DOCUMENTS

| EP | 0 523 856 A2 | 6/1992 | H01L/21/90 |
|---|---|---|---|
| EP | 0 587 400 A2 | 9/1993 | H01L/21/90 |

* cited by examiner

Primary Examiner—Douglas A. Wille

(57) ABSTRACT

An improved manufacturing process and an improved device made by the process are described for forming via interconnects between metal layers in a multilevel metallization structure. This process essentially eliminates exploding vias due to vias extending beyond the edge of metal lines. The strong reaction is caused by the chemical interaction of metal lines beneath vias with reactants and/or reaction products associated with via fill. An insulating cap layer is deposited on the patterned and etched metal layer before depositing the interlevel dielectric layer above it. A two-step via etch process selectively removes portions of the cap layer within vias prior to via fill. The remaining cap layer within the vias covers, and thereby protects, otherwise vulnerable underlying metal from the damaging chemical interaction during via fill. Using this process, metal borders around vias can be reduced or eliminated, thereby increasing circuit packing density.

9 Claims, 7 Drawing Sheets

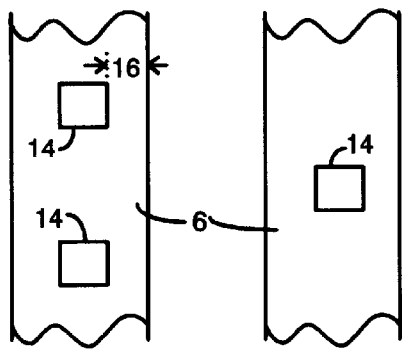
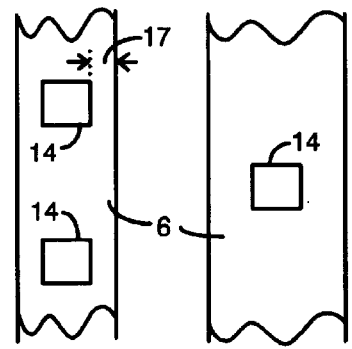
FIG. 2A        FIG. 2B
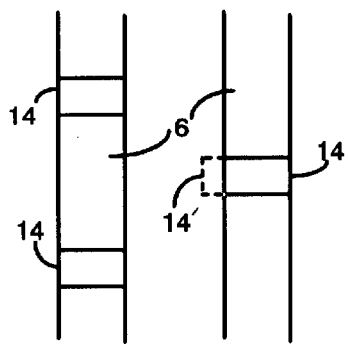
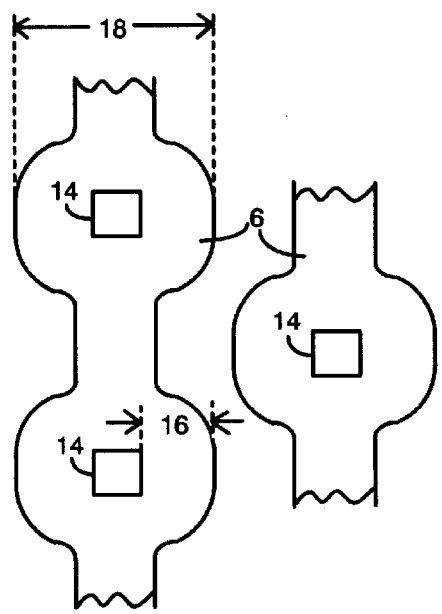
FIG. 2C        FIG. 2D

MANUFACTURING PROCESS FOR BORDERLESS VIAS WITH RESPECT TO UNDERLYING METAL

FIELD OF THE INVENTION

This invention relates to processes for formation of vias used for interconnecting metal layers of a multilevel metallization structure employed in integrated circuits.

BACKGROUND OF THE INVENTION

Integrated circuits are becoming increasingly fast, and correspondingly, devices and feature sizes are shrinking. This allows for much higher device packing density on chips, and consequently lower cost per device.

When devices were relatively large, one layer of metal was adequate to provide all of the metal interconnections and other wiring needed to build a complete integrated circuit, without wiring requirements limiting device packing density. To avoid such a limitation as device dimensions have shrunk, it has become necessary to develop multilevel metallization schemes and to reduce certain metal dimensions.

In a single level metallization system, contact is made to the underlying silicon devices through contact holes etched through the dielectric separating the silicon from the interconnect metal. Multilevel metallization systems are comprised of alternating layers of dielectric and metal materials. The metal interconnects on the metal layer closest to the silicon surface (M1), make contact to the underlying silicon devices through contact holes, just as in single level systems. The successive metal layers, designated M1 to M(n), where n is the number of metal layers, are electrically connected to each other as required by appropriately located holes, referred to as vias, through the interlevel dielectric layers (ILD's). The dielectric layer between the silicon surface and the first metal layer closest to the silicon is designated ILD0. Vias are typically filled with a conductor such as aluminum or tungsten. The conducting material filling the via is called a via plug.

Interconnect lines on each metal layer are separated by spaces. These spaces are filled with dielectric when the next dielectric layer is deposited. The width of one metal line plus one space is referred to as pitch. Many factors, including transistor size, circuit layout, and the number of metal layers that can be used, enter into the choice of the pitch for the different metal layers. The minimum pitch for M1 is usually set by the minimum transistor size and by lithography tolerances to insure that adjacent lines, at the minimum pitch, completely cover contacts without shorting to each other. After pitch is determined, the line and space dimensions are defined by circuit performance requirements such as RC time constants and reliability, as well as by the capability of the process to provide lines of minimum width. Minimum pitch for the M2 and M3 layers of metal are generally successively larger than for the M1 level, being determined by factors other than transistor size. If, however, vias are stacked one over another between successive metal layers, as is sometimes done to enhance performance and increase packing density, the pitches of all the layers contacted by the stacked via are generally maintained the same to facilitate layout.

Via dimensions are typically determined by the design current expected to flow through the via plug and by the resistance of the plug itself, as well as by variances and limitations imposed by lithography, etch, and via-fill processes. As device dimensions shrink and the line widths at the lower metallization levels such as M1 and M2 become correspondingly smaller, via cross sectional area decreases, and the via aspect ratio (AR), defined as via height/via width, tends to increase. The via aspect ratio is critical to the determination of how, and with what metal, the via is filled.

The generally preferred manufacturing method of filling vias having AR>1 is Chemical Vapor Deposition of tungsten, (CVD tungsten process). Generally, the CVD tungsten process inherently provides better step coverage than competing processes such as sputtering of aluminum. It therefore is a better choice for uniformly coating the sides and bottoms of holes with high aspect ratio, thus yielding substantially void free plugs. Additionally, the CVD tungsten process is a manufacturing-proven process for filling high aspect ratio vias.

The following two somewhat different CVD tungsten processes are in common use:
1. Selective Tungsten CVD, and
2. Blanket Tungsten CVD with Etchback.

Both are based on the chemical reduction of tungsten hexafluoride ($WF_6$), a highly reactive gas. The process used for via fill between two metal layers is Blanket Tungsten CVD. In this process, tungsten hexafluoride is reduced by hydrogen in accordance with the reaction:

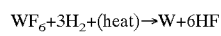

$$WF_6 + 3H_2 + (heat) \rightarrow W + 6HF$$

The blanket tungsten process results in deposition of tungsten over the entire surface of the interlevel dielectric layer, and in filling of the vias over the underlying metal. The underlying metal is usually aluminum or an aluminum alloy, the preferred interconnect metal in most applications. In some applications, the entire tungsten layer deposited on the dielectric surface is subsequently etched back, leaving only the plug in the via. In other applications the tungsten on the dielectric surface is patterned and used as interconnect metal.

Before depositing the CVD tungsten, a thin barrier/nucleation/adhesion film is deposited on the dielectric surface and into the vias, coating the underlying aluminum with a protective barrier. This barrier prevents damaging interaction between the aluminum and the reactants and reaction products of the tungsten deposition. Preferred materials for the barrier/nucleation/adhesion film are TiN and TiW, with TN being the most frequently used. A serious yield problem arises if, for any reason such as worst case tolerance buildup, misalignment of vias and the underlying metal result in vias not mating properly and extending outside of the underlying metal. If this happens there is a high probability that the edge of the underlying aluminum interconnect metal, exposed due to the misalignment, will not be adequately protected by the barrier layer. This would result in a violent chemical reaction between the exposed aluminum and the $WF_6$ and/or HF during deposition of the tungsten plug, causing severe damage to the structure. This phenomenon has been termed "exploding vias".

To insure that interconnect metal and via plug make contact over the entire end surface of the plug and to reduce the occurrence of exploding vias, keeping their effect on yield to acceptably low levels, it has been common practice to provide for a minimum required border of metal around the via. This border or overlap is intended to account for any variations in metal and via dimensions and also for any misalignment tolerance of the lithography tool used. Borders are made sufficiently large to assure that vias do not extend beyond the underlying metal under worst case conditions of misalignment and/or dimensional tolerance buildup. If the metal line width is not adequate to provide the minimum required border, it is increased where it encounters a via, as shown in FIG. 2d. Since the minimum space can not decrease where the line width increases, the minimum pitch in this contacted case is greater than the non-contacted pitch previously described. This practice has the disadvantage of limiting the device packing density due to the increase in contacted metal pitch.

Design rules establishing the minimum size of borders around vias can be tightened, allowing smaller borders around vias if:

1. Tolerances associated with line, space, and pitch dimensions are reduced, and/or,
2. Tolerances associated with misalignment of vias caused by lithography are reduced.

While these steps will reduce the loss in device packing density caused by an increase in metal pitch due to widening of metal lines at vias, they do not fully compensate for that loss, and they also introduce added cost to the manufacturing process.

SUMMARY OF THE INVENTION

I have provided an improved manufacturing process for forming via interconnects between metal layers in a multi-level metallization structure. Using my process, the exploding via phenomenon is substantially eliminated despite occurrences of misalignment or dimensional buildup which causes vias to extend beyond underlying metal. This improved process, which has application primarily in the lower levels of metal, where line width and pitch are very small, utilizes deposition of a thin insulating cap layer on the underlying metal lines before depositing the interlevel dielectric layer, and utilizes a two step via etch process for selectively removing portions of the cap layer.

It is an object of this invention to provide an improved manufacturing process for fabricating multilevel metallization structures.

It is a further object to provide a manufacturing process which improves yield in the fabrication of multilevel metallization structures.

It is a further object to provide an improved higher density device and a manufacturing process for multilevel metallization structures which permits higher device packing density on chips.

It is a further object to provide an integrated circuit with an improved multilevel metallization structure which permits higher device packing density on chips.

It is a further object to provide a manufacturing process which allows reducing the contacted pitch on metal layers of multilevel metallization structures.

It is a further object to provide a manufacturing process which permits the use of borderless vias in multilevel metallization structures.

It is a further object to provide a manufacturing process which permits loosening of the design rules that establish the minimum size of borders around vias in the fabrication of multilevel metallization structures.

It is a further object to provide a manufacturing process which substantially eliminates the problem of exploding vias in the fabrication of multilevel metallization structures.

It is a further object to provide a manufacturing process for multilevel metallization structures in which the surfaces of the interconnect metal underlying a via are protected by a cap layer from reactants and reaction products associated with the via fill step.

It is a further object to provide a manufacturing process tolerant of misalignment of vias and underlying metal in the fabrication of multilevel metallization structures.

DESCRIPTION OF THE DRAWINGS

FIG. 2a shows a plan view of vias and underlying metal interconnect lines with minimum required borders provided.

FIG. 2b shows a plan view of vias and underlying metal interconnect lines with less than minimum required borders provided.

FIG. 2c shows a plan view of vias and underlying metal interconnect lines with no borders.

FIG. 2d shows a plan view of vias and underlying metal interconnect lines widened around the vias to provide minimum required borders.

It should be noted that the figures are not drawn to scale and that the proportions of illustrated parts do not reflect actual dimensions as they relate to implementation of the invention.

DETAILED DESCRIPTION OF THE INVENTION

Figure 1:
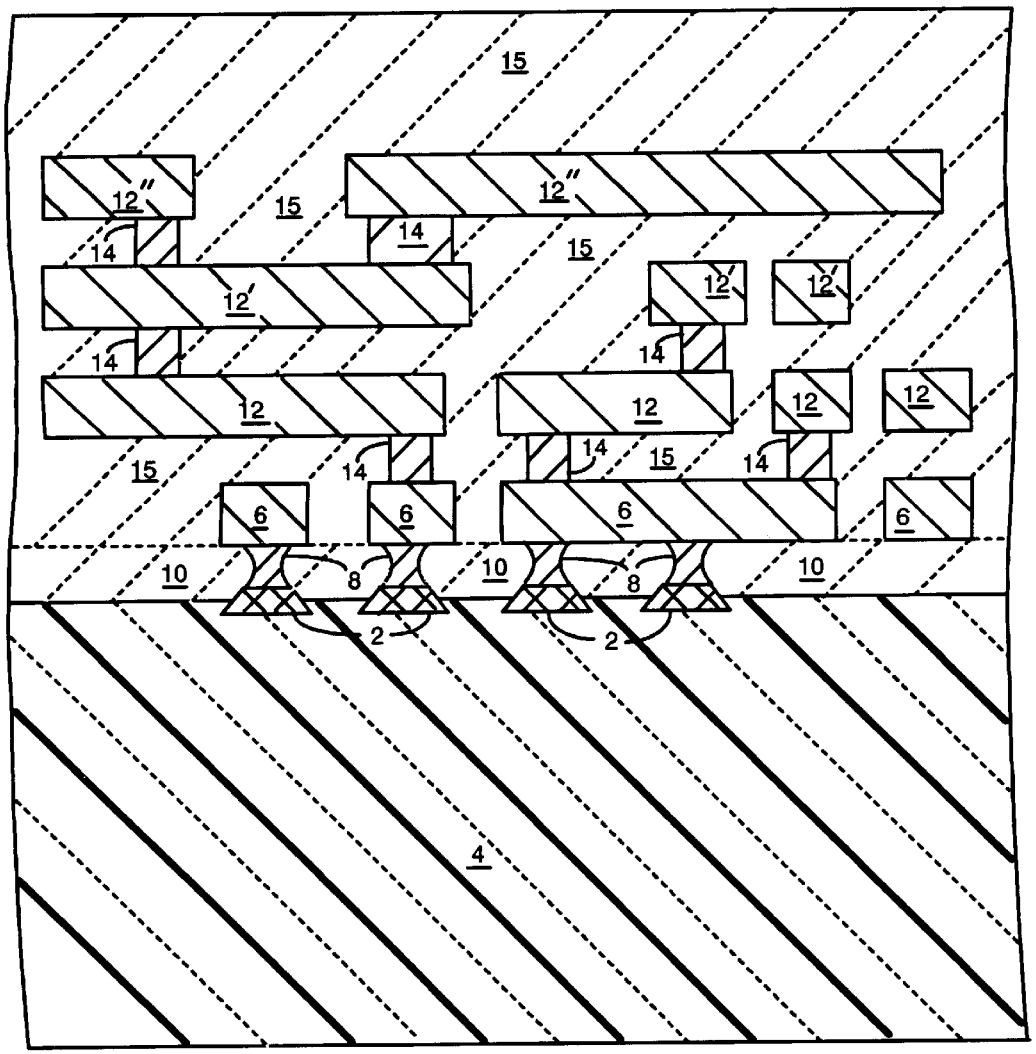
FIG. 1 is a schematic cross section of a four level metallization system interconnecting devices on a silicon wafer.

FIG. 1 shows a cross section of a multi-level metallization system which could utilize this invention. Devices 2 in silicon wafer 4 are connected to first layer (M1) of metal interconnects 6 through contact openings 8 in dielectric layer ILD0 10. Layer of metal interconnects 6 is connected to metal layer 12, and layer 12 is connected to layer 12', through vias 14 in interlevel dielectric 15. My invention is applicable to via interconnects and to the process for forming them between any two metal layers.

According to my invention, a cap layer preferably of silicon nitride or silicon oxynitride is deposited over the entire surface of any of the patterned and etched metal layers M1 through M(n) of a multilevel metallization structure, before depositing the next interlevel dielectric layer. The cap layer is substantially inert to via etch processes and chemistry and to reactants and reaction products associated with the subsequent via-fill process steps and serves as a barrier to protect the underlying interconnect metal from those reactants and reaction products during via fill. Standard silicon nitride or silicon oxynitride deposition processes may be employed. The exact stoichiometry of these layers is not critical. For example, the silicon nitride has been deposited using Applied Materials Precision model 5000 employing $SiH_4|N_2|NH_3$ @ 105|1600|75 SCCM. The chamber base pressure was 4.85 torr with power 375 w and temperature 400° C. For the oxynitride deposition, I use a Novellus Concept One employing $N_2|SiH_4|N_2O|NH_3$ @ 5.0|0.2|2.2|0.90 slm. The chamber pressure was 2.1 torr @ RF power HF of 0.35 KW and temperature of 400° C.

With reference to FIGS. 2a–2d, vias 14, of constant dimension, are shown on adjacent underlying metal lines 6, of varying width. In FIG. 2a, minimum required metal borders 16 are provided around the vias. In FIG. 2b, borders 17, less than minimum required borders 16, are provided around the vias. FIG. 2c illustrates borderless vias. In FIG. 2d, metal line width 18 adjacent via 14 is increased to meet the condition for minimum required borders 16. The probability of dimensional tolerance buildup causing vias to extend outside underlying metal is high in the cases illustrated in FIG. 2b and FIG. 2c. This invention provides a process for substantially eliminating catastrophic yield problems most likely to occur in such cases, including the case where the via extends beyond the metal as shown at 14' of FIG. 2C. The invention is also applicable in cases where minimum border requirements are satisfied.

Figure 3:
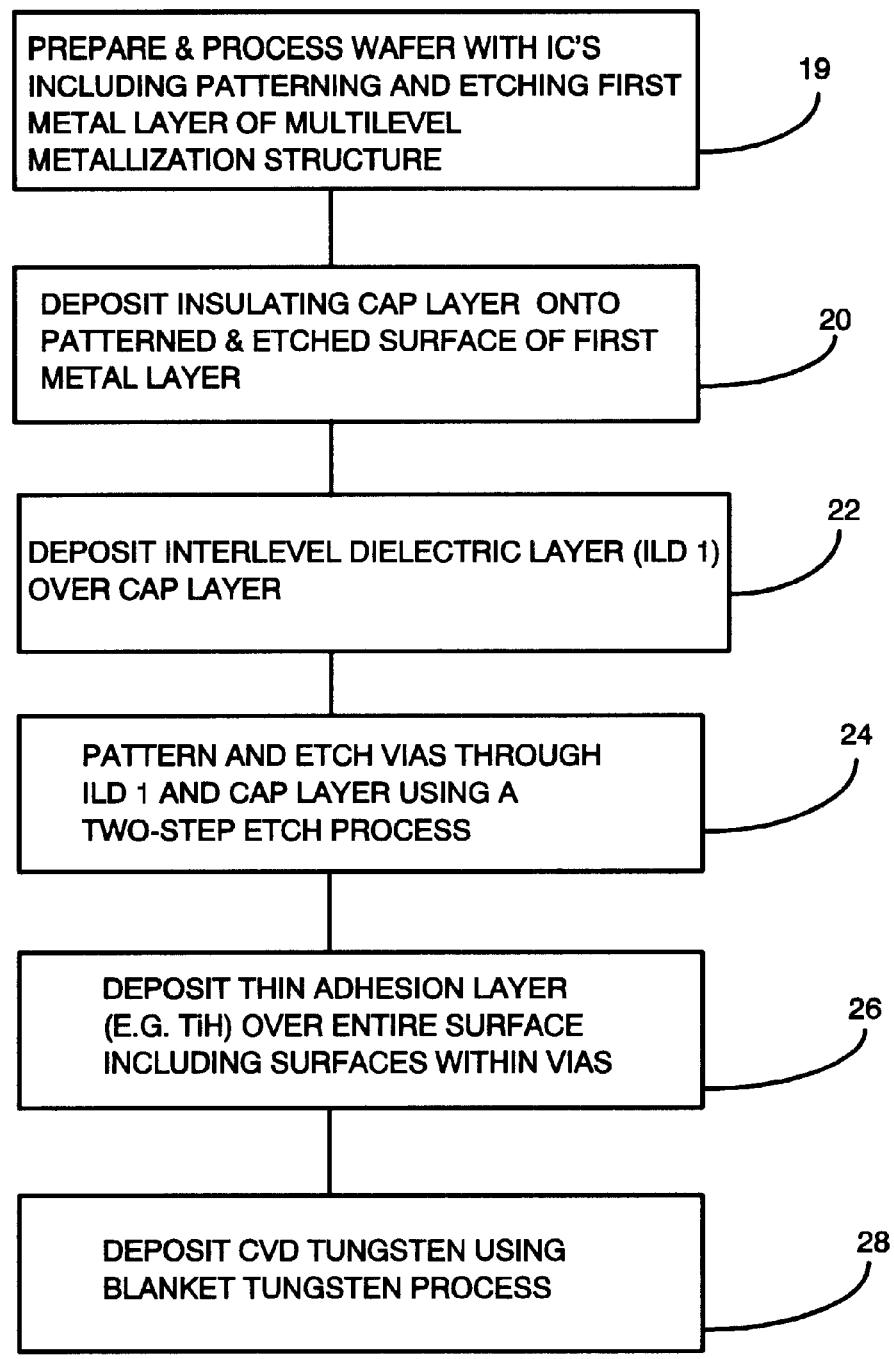
FIG. 3 is a process flow embodiment utilizing the invention.

With reference to FIG. 3, a preferred process flow embodiment utilizing this invention is described. In step 19, an integrated circuit wafer is processed through patterning and etching of the first metal layer 6 of the multilevel metallization structure, utilizing standard processes which are not part of this invention. The standard processes for metal and ILD deposition, patterning, and etching are described in "Handbook of Multilevel Metallization for Integrated Circuits," S. Wilson, C. J. Tracy, J. T. Freeman Jr., eds, Noyes Publications, 1993, pp. 126–169, pp. 461–569, which is hereby incorporated by reference. By way of example in CMOS technology, after formation of the source/drain regions, ILDO 10, usually comprising $SiO_2$, is deposited, contact holes 8 are patterned, etched and filled, and the first metal layer 6, usually aluminum or an aluminum alloy, is deposited, patterned and etched, to form the M1 interconnect structure. In step 20, the wafer is installed in a deposition chamber, such as a Chemical Vapor Deposition (CVD) system, and an insulating cap layer, which may be comprised of silicon nitride or silicon oxynitride, by way of example, is deposited onto the wafer surface, covering the patterned metal interconnect lines 6 and the exposed dielectric regions of ILDO 10. In step 22, ILD1, commonly $SiO_2$, is chemically vapor deposited over the nitride cap layer. In step 24, vias are patterned into ILD1, and etched in a two-step process through ILD1 and the cap layer to expose the underlying metal. In step 26, a thin adhesion/nucleation/barrier layer of TiN is deposited over the entire wafer surface, including the exposed upper surface of the ILD1 layer and the exposed surfaces in the vias. In step 28, tungsten is deposited, by the Blanket Tungsten CVD process, into the vias and over the entire surface of the inter level dielectric, forming via plugs and a tungsten metal layer on the surface of inter level dielectric layer ILD1.

Figure 4:
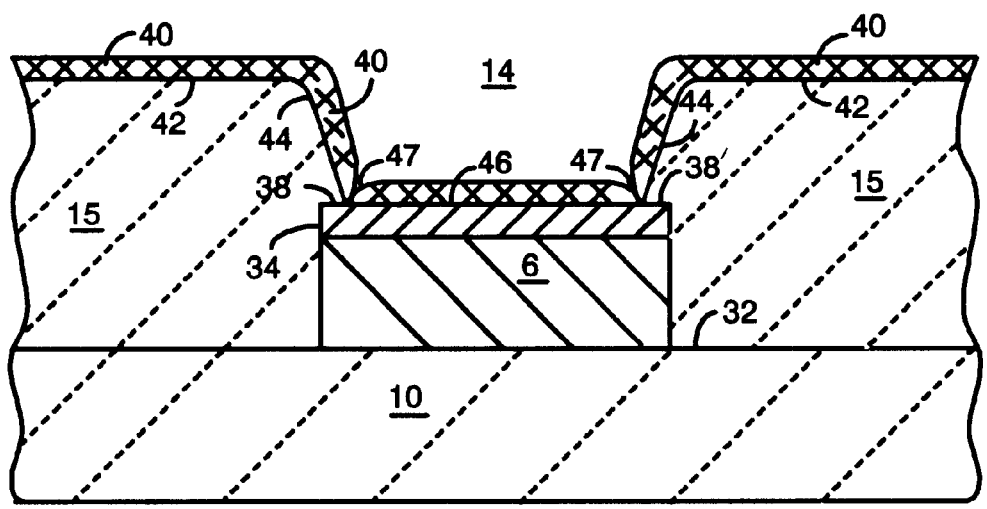
FIG. 4 is a cross sectional view of a via, centrally aligned with respect to an underlying metal interconnect line with no cap layer utilized.
Figure 5:
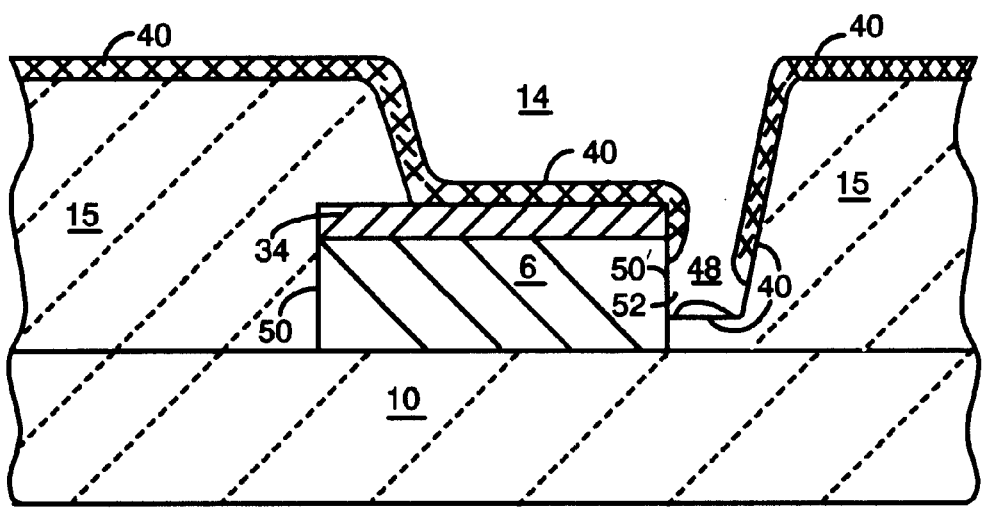
FIG. 5 is a cross sectional view of a via, misaligned with respect to an underlying metal interconnect line with no cap layer utilized.

FIGS. 4 and 5 illustrate the source of the exploding via phenomenon when this inventive process is not utilized.

With reference to FIG. 4, metal interconnect line 6 in the first metal layer is shown in cross section on surface 32 of dielectric layer (ILDO) 10. An electrically conducting coating 34 which is chemically inert with respect to reactants and reaction products of the Blanket Tungsten CVD via fill process, is shown deposited on first metal layer 6 before patterning and etching of the metal. This coating 34 may also serve as an antireflection coating (ARC) which, by way of example, may be approximately 1100 Angstroms thick and preferably be comprised of TiN. Via 14, reactively ion etched with standard equipment through interlevel dielectric layer (ILD1) 15, is shown in substantially perfect alignment with underlying metal interconnect line 6, leaving uniform border 38 and 38' around via 14. A barrier/nucleation/adhesion layer 40 is deposited on top surface 42 of interlevel dielectric layer 15, and on via sidewall 44, and on underlying conductive surface 46, and provides a substantially continuous barrier preventing a chemical reaction between interconnect line 6 and reactants and reaction products $WF_6$ and HF of the subsequent Blanket Tungsten CVD via fill process. In this case of a properly aligned via, the ARC layer 34 also provides added chemical isolation of the aluminum interconnect metal from $WF_6$ and HF. This can be particularly important at the intersection 47 of surfaces within vias, where discontinuities in the thin barrier/nucleation/adhesion layer 40 are likely to occur. The barrier/nucleation/adhesion layer 40 additionally promotes adhesion of CVD tungsten (not shown) to surfaces 42, 44 of interlevel dielectric layer 15.

With reference to FIG. 5, via 14 is shown misaligned with respect to underlying metal line 6, causing via 14 to extend beyond metal line 6. During via etch, this results in deep etching of dielectric 15, and formation of high aspect ratio region 48, adjacent to edge 50' of metal line 6. Barrier/nucleation/adhesion layer 40 will, with high probability, have one or more discontinuities 52 on metal edge 50' in high aspect ratio region 48. Metal edge 50' of aluminum interconnect line 6, having no ARC, is therefore directly exposed to reactants and reaction products $WF_6$ and HF of the subsequent Blanket Tungsten CVD via fill process at the discontinuities 52. This can result in inoperable vias and/or a violent chemical reaction and severe damage to the structure, referred to as exploding via. FIGS. 6 through 9 illustrate how my inventive process and structure prevents exploding vias.

Figure 6:
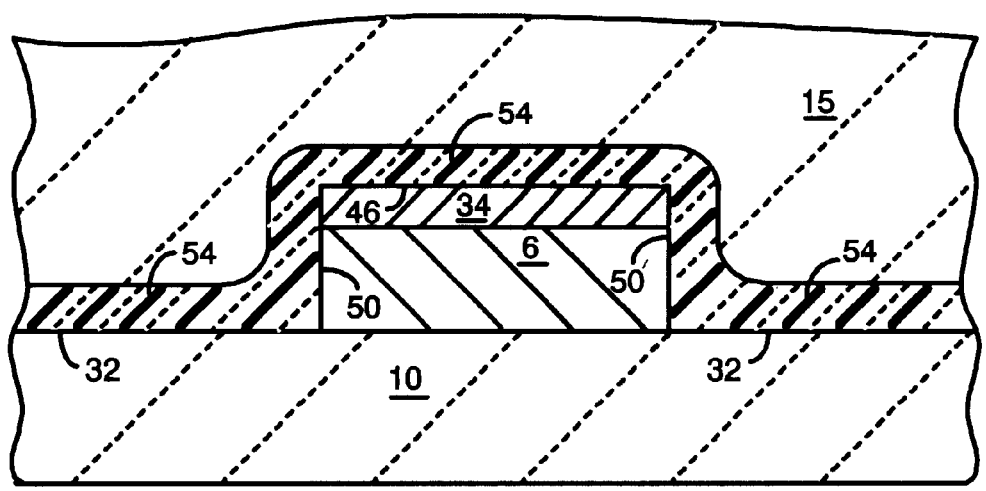
FIG. 6 is a cross sectional view prior to via etch, of an interlevel dielectric layer above a metal interconnect line, and a cap layer between the two.

With reference to FIG. 6, the thickness of the deposited silicon nitride or silicon oxynitride insulating cap layer 54 should be in the range of greater than 100 Å and preferably less than 100 Å and is shown covering surface 46 of ARC 34, and sidewalls 50 and 50' of interconnect line 6, and exposed surfaces 32 of dielectric layer (ILDO) 10. Interlevel dielectric (ILD1) 15, deposited after deposition of cap layer 54, is shown prior to via etch.

Figure 7:
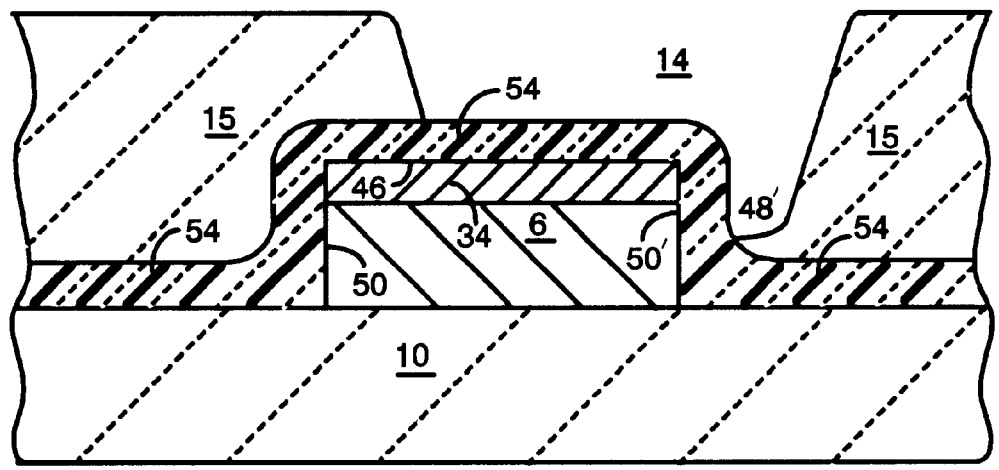
FIG. 7 is a cross sectional view of a via, misaligned with respect to an underlying metal interconnect line, shown after the first step of a two-step via etch process. A cap layer is interposed between the via and the underlying line.

With reference to FIG. 7, via 14, misaligned with respect to underlying interconnect line 6, is shown after the first step or portion of the two-step via etch process. The first via etch step has high directionality and a high selectivity. Specifically, the etch has a high interlevel-dielectric-oxide etch rate, as compared to insulating-cap-layer etch rate. A selectivity of at least 5 to 1 is required, and 10 to 1 or greater is preferred. The cap layer thereby serves as an etch-stop layer for the interlevel dielectric oxide via etch. Over-etching to assure complete removal of dielectric oxide 15 within via 14, above interconnect line 6, results in formation of high aspect ratio region 48' due to misalignment. Cap layer 54 is substantially unaffected by this first etch step. The etch can be carried out in Applied Materials model Centura pursuant to the preferred process described in the paper by M. Armacost, et al., "Selective Oxide:Nitride Dry Etching in a High Density Plasma Reactor," ECS Spring Meeting Extended Abstracts, Vol. 93-1, p. 369 (1993). This paper is incorporated herein by reference.

Figure 8:
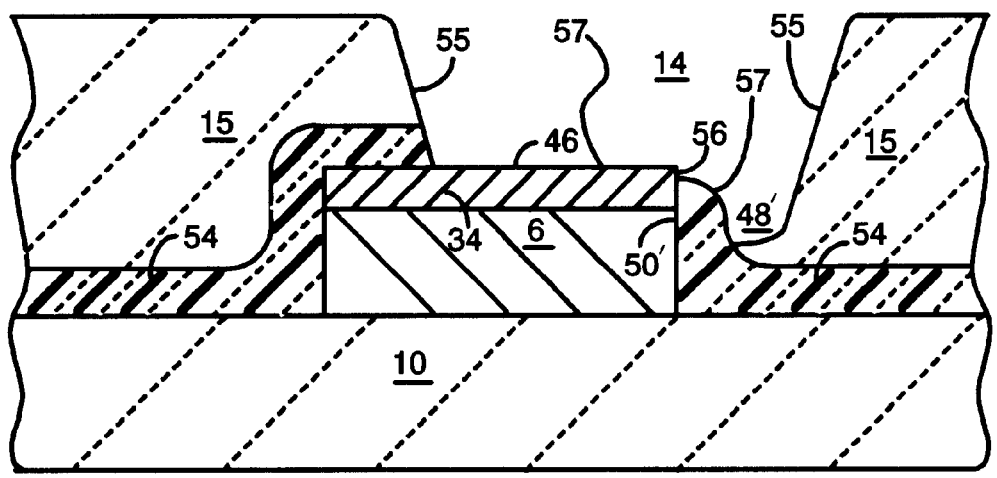
FIG. 8 is a cross sectional view of a via, misaligned with respect to an underlying metal interconnect line, shown after the second step of a two-step via etch process. The cap layer interposed between the via and the underlying line is shown partially etched away.

With reference to FIG. 8, via 14, having sidewalls 55 and bottom end surface 57 misaligned with respect to underlying interconnect line 6, is shown after the second step or portion of the two-step via etch process. The second etch step has high directionality and moderate selectivity, specifically a moderate insulating-cap-layer etch rate as compared to interlevel-dielectric-oxide etch rate. Selectivity may fall in the range greater than 1:1, preferably 1 to 2. The cap layer 54 within via 14 on the top surface 46 of ARC 34 is completely removed to surface 46 by the second etch step. The selectivity of each of the two etch steps to TiN is at least 10:1 and is preferably greater. The overetch necessary to assure this complete removal results in some etching of cap layer 54 covering ARC 34 on edge 50' near corner 56. However the aluminum portion of edge 50' remains completely covered by the cap layer. Reactive ion etch processes are commercially available that meet the directionality and etch selectivity requirements of both steps of the two-step via etch process of this invention for nitride or oxynitride cap layers. The TiN layer 46 needs to be at least thick enough so that the edge 56 remains above the edge of the interface between the aluminum 6 and TiN 46 as seen FIG. 8. The process for the second step etch can be of the same chemistry as the first step but with higher fluorocarbon flow rates.

Figure 9:
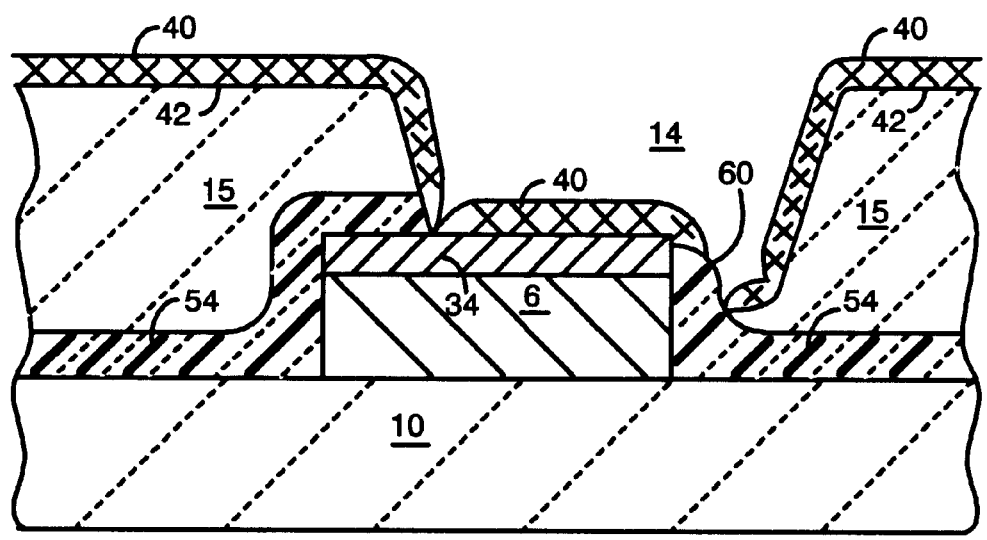
FIG. 9 is a cross sectional view of a via, misaligned with respect to an underlying metal interconnect line, shown after a two step via etch process and after deposition of a thin barrier/nucleation/adhesion layer.

With reference to FIG. 9, barrier/nucleation/adhesion layer 40 is shown deposited over surface 42 of interlevel dielectric 15 and into misaligned via 14 after the two-step via etch process. Aluminum portion 6 of the interconnect line is protected, by the barrier/nucleation/adhesion layer 40 and additionally by the ARC 34, on the top, and by the cap layer 54 on the side, from interaction with reactants and reaction products $WF_6$ and HF of the blanket tungsten CVD process.

Utilizing this inventive process the problem of exploding vias is eliminated, allowing smaller borders or borderless vias, as well as vias which extend beyond the edge of the underlying metal line. The circuit packing density can thereby be increased and cost per device lowered.

Although the preferred process described herein utilizes a silicon nitride or silicon oxynitride insulating cap layer deposited by chemical vapor deposition, a two-step via etch process, and an ARC on the metal lines, the invention should not be considered limited to any or all of these exact implementations. The scope of the invention should be construed in light of the claims. With this in mind,

I claim:

1. An integrated circuit having a plurality of semiconductor devices therein and a multilevel metallization structure for interconnection of said semiconductor devices thereon, said multilevel metallization structure comprising, a plurality of substantially parallel, separated, patterned metal layers, each said metal layer being separated by an interlevel dielectric (ILD) layer of silicon dioxide therebetween, said patterned metal layers being comprised of electrically conducting lines, each of said electrically conducting lines including a bottom Al material portion and a top portion, said top portion being an electrically conducting coating, said electrically conducting coating comprised of a material chemically inert with respect to WF6 and HF, said electrically conducting lines having top surfaces and edge surfaces, said edge surfaces including a bottom portion of Al material and a top portion comprising said electrically conducting coating material;

said interlevel dielectric layers between said metal layers having vias therethrough, each said via having via sidewalls 55 and a via bottom end surface 57, wherein at least one of said vias has a first portion of said via bottom end surface 57 being contiguous with a portion of said top surface of one of said electrically conducting lines and a second portion of said via bottom end surface 57 extending past said edge surface of said one of said electrically conducting lines and not being atop said one of said electrically conducting lines, said one via thereby being misaligned with respect to said one of said electrically conducting lines, said vias having conducting via plugs therein, said via plugs comprising W and providing electrical connectivity between said metal layers;

one or more of said metal layers having an insulating ILD via etch stop cap layer contiguously thereon, said via etch stop cap layer being a protective layer between said bottom portion of Al material of said electrically conducting edge surfaces and said via plugs, said via etch stop cap layer being made from a material which is substantially non-volatilized by silicon dioxide etchants, said via etch stop cap layer having openings therethrough within said vias, said contiguous etch stop cap layer completely covering said bottom Al or Al alloy portion of said electrically conducting edge surfaces, and said etch stop cap layer covering said electrically conducting top surfaces except at said openings, and wherein said Al material is selected from the group consisting of Al and Al alloys.

2. The integrated circuit of claim 1 wherein said ILD via etch stop cap layer is selected from the group consisting of silicon nitride and silicon oxynitride.

3. The integrated circuit of claim 2 wherein said ILD via etch stop cap layer thickness is greater than 100 Å and less than 1000 Å.

4. The integrated circuit of claim 1 wherein said electrically conducting coating is TiN.

5. An integrated circuit having a plurality of semiconductor devices and a multilevel metallization structure thereon, said integrated circuit being fabricated by a method comprising the steps of, providing a semiconductor substrate having devices therein to be connected, having an Al material layer deposited thereon;

depositing an electrically conducting coating atop said Al material layer, said electrically conducting coating comprised of a material chemically inert with respect to WF6 and HF;

patterning and etching said Al material layer and said electrically conducting coating to provide electrically conducting lines having top surfaces and edge surfaces, said edge surfaces including a bottom Al material portion and a top portion comprising said electrically conducting coating material;

depositing an insulating ILD via etch stop cap layer contiguously over said electrically conducting lines, said ILD via etch stop cap layer thereby covering said top surfaces and said edge surfaces of said electrically conducting lines, said etch stop cap layer being made from a material which is substantially non-volatilized by silicon dioxide etchants;

depositing a silicon dioxide ILD dielectric layer over said insulating ILD via etch stop cap layer;

etching vias in said ILD dielectric layer and said ILD via etch stop cap layer to expose selected portions of said electrically conducting lines, each said via having via sidewalls 55 and a via bottom end surface 57, wherein at least one of said vias has a first portion of said via bottom end surface 57 being contiguous with a portion of said top surface of one of said electrically conducting lines and a second portion of said via bottom end surface 57 extending past said edge surface of said one of said electrically conducting lines and not being atop said one of said electrically conducting lines, said one via thereby being misaligned with respect to said one of said electrically conducting lines, said via etching process completely removing said insulating ILD via etch stop cap layer from said top surfaces of said electrically conducting lines within said vias while leaving at least a portion of said insulating ILD via etch stop cap layer completely covering said bottom Al material portion of said edge surfaces of said electrically conducting lines within said vias, for protecting said bottom Al material portion of said edge surfaces from demaging interaction with chemicals associated with subsequent via fill process steps; and filling said etched vias with a Blanket Tungsten CVD process;

wherein said Al material is selected from the group consisting of Al and Al alloys.

6. The integrated circuit of claim 1, wherein said one via is borderless.

7. The integrated circuit of claim 2, wherein said one via is borderless.

8. The integrated circuit of claim 3, wherein said one via is borderless.

9. The integrated circuit of claim 5, wherein said one via is borderless.

\* \* \* \* \*